(12) United States Patent
Engelhardt et al.

(10) Patent No.: US 12,179,610 B2
(45) Date of Patent: Dec. 31, 2024

(54) SYSTEMS AND METHODS FOR SINGLE CHANNEL FAULT ENCODING FOR INVERTER FOR ELECTRIC VEHICLE

(71) Applicant: BorgWarner US Technologies LLC, Wilmington, DE (US)

(72) Inventors: Marc R. Engelhardt, Kokomo, IN (US); Jack Lavern Glenn, Union Pier, MI (US); Peter Allan Laubenstein, Sharpsville, IN (US)

(73) Assignee: Borg Warner US Technologies LLC, Auburn Hills, MI (US)

( * ) Notice: Subject to any disclaimer, the term of this patent is extended or adjusted under 35 U.S.C. 154(b) by 70 days.

(21) Appl. No.: 18/063,381

(22) Filed: Dec. 8, 2022

(65) Prior Publication Data

US 2024/0106378 A1 Mar. 28, 2024

Related U.S. Application Data

(60) Provisional application No. 63/378,601, filed on Oct. 6, 2022, provisional application No. 63/377,486, filed
(Continued)

(51) Int. Cl.
*H02P 27/08* (2006.01)
*B60L 3/00* (2019.01)
(Continued)

(52) U.S. Cl.
CPC ............ *B60L 50/60* (2019.02); *B60L 3/003* (2013.01); *B60L 15/007* (2013.01); *B60L 15/08* (2013.01);
(Continued)

(58) Field of Classification Search
CPC ........ B60L 50/60; G06F 1/08; G06F 13/4004; H01L 21/4882; H02J 7/0063;
(Continued)

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

WO 2007093598 A1 8/2007
WO 2019034505 A1 2/2019
(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.
(Continued)

*Primary Examiner* — Muhammad S Islam
(74) *Attorney, Agent, or Firm* — Joshua M. Haines; Bookoff McAndrews, PLLC

(57) ABSTRACT

A system comprises: an inverter configured to convert DC power from a battery to AC power to drive a motor, wherein the inverter includes: a point-of-use controller configured to: detect a fault; determine a fault type of the detected fault from among n fault types; determine a fault response group to which the determined fault type belongs from among m fault response groups; encode the determined fault response group; and transmit the encoded fault response group via a communication interface; and a phase controller configured to: receive the encoded fault response group from the point-of-use controller via the communication interface; determine the fault response group; decode the determined fault response group; and output the decoded fault response group.

20 Claims, 9 Drawing Sheets

Related U.S. Application Data on Sep. 28, 2022, provisional application No. 63/377,512, filed on Sep. 28, 2022, provisional application No. 63/377,501, filed on Sep. 28, 2022.

(51) Int. Cl.
| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H01L 29/66* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *B60L 15/20* | (2006.01) |
| *H03K 19/20* | (2006.01) |

(52) U.S. Cl.
CPC ............ *B60L 50/40* (2019.02); *B60L 50/51* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H01L 29/66553* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H05K 7/20927* (2013.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC .... H02M 1/0009; H02M 1/0054; H02M 1/08; H02M 1/084; H02M 1/088; H02P 27/06; H02P 27/08; H02P 27/085; H02P 29/024; H02P 29/027; H02P 29/68; H05K 1/145; H05K 1/181; H05K 1/182; H05K 5/0247; H05K 7/20154; H05K 7/2049; H05K 7/20854; H05K 7/209; H05K 7/20927; H05K 2201/042; H05K 2201/10166; H03K 19/20

See application file for complete search history.

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |

(56) References Cited

U.S. PATENT DOCUMENTS

| | | |
|---|---|---|
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2014/0085763 A1* | 3/2014 | Varma ............... H02H 3/08 361/93.1 |
| 2017/0331469 A1 | 11/2017 | Kilb et al. |
| 2019/0018731 A1* | 1/2019 | Schat ............. G01R 31/3181 |
| 2019/0270417 A1* | 9/2019 | Spesser ............ B60L 3/0007 |
| 2019/0341870 A1* | 11/2019 | Baurle ............. G01R 31/34 |
| 2020/0195121 A1 | 6/2020 | Keskar et al. |
| 2021/0005711 A1 | 1/2021 | Martinez-Limia et al. |
| 2022/0052610 A1 | 2/2022 | Plum |
| 2022/0182004 A1 | 6/2022 | Heckroth et al. |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |

(56) References Cited

U.S. PATENT DOCUMENTS

| | | |
|---|---|---|
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | | |
|---|---|---|---|
| WO | 2020156820 | A1 | 8/2020 |
| WO | 2020239797 | A1 | 12/2020 |
| WO | 2021110405 | A1 | 6/2021 |
| WO | 2021213728 | A1 | 10/2021 |
| WO | 2022012943 | A1 | 1/2022 |
| WO | 2022229149 | A1 | 11/2022 |
| WO | 2023006491 | A1 | 2/2023 |
| WO | 2023046607 | A1 | 3/2023 |
| WO | 2023094053 | A1 | 6/2023 |
| WO | 2023110991 | A1 | 6/2023 |
| WO | 2023147907 | A1 | 8/2023 |
| WO | 2023151850 | A1 | 8/2023 |
| WO | 2023227278 | A1 | 11/2023 |
| WO | 2023237248 | A1 | 12/2023 |
| WO | 2024006181 | A2 | 1/2024 |
| WO | 2024012743 | A1 | 1/2024 |
| WO | 2024012744 | A1 | 1/2024 |
| WO | 2024022219 | A1 | 2/2024 |
| WO | 2024041776 | A1 | 2/2024 |
| WO | 2024046614 | A1 | 3/2024 |
| WO | 2024049730 | A1 | 3/2024 |
| WO | 2024049884 | A1 | 3/2024 |
| WO | 2024049909 | A1 | 3/2024 |
| WO | 2024056388 | A1 | 3/2024 |
| WO | 2024068065 | A1 | 4/2024 |
| WO | 2024068076 | A1 | 4/2024 |
| WO | 2024068113 | A1 | 4/2024 |
| WO | 2024068115 | A1 | 4/2024 |
| WO | 2024083391 | A1 | 4/2024 |
| WO | 2024093384 | A1 | 5/2024 |
| WO | 2024104970 | A1 | 5/2024 |
| WO | 2024108401 | A1 | 5/2024 |
| WO | 2024110106 | A1 | 5/2024 |
| WO | 2024110265 | A1 | 5/2024 |
| WO | 2024110297 | A1 | 5/2024 |
| WO | 2024114978 | A1 | 6/2024 |
| WO | 2024114979 | A1 | 6/2024 |
| WO | 2024114980 | A1 | 6/2024 |
| WO | 2024128286 | A1 | 6/2024 |
| WO | 2024132249 | A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618—(Mar. 2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

\* cited by examiner

SYSTEMS AND METHODS FOR SINGLE CHANNEL FAULT ENCODING FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for fault encoding and compression using a single channel, and, more particularly, to techniques for encoding a fault using a fault response group to which a fault type of the fault belongs.

BACKGROUND

Inverters, such as those used to drive a motor in an electric vehicle, for example, are responsible for converting High Voltage Direct Current (HVDC) into Alternating Current (AC) to drive the motor. In an inverter, fault reporting is an important aspect of control of the inverter and motor. Fault reporting may have a delay between detecting the fault and receiving a command for a desired reaction. Fault reporting may consume substantial bandwidth of messaging communication in the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a point-of-use controller configured to: detect a fault; determine a fault type of the detected fault from among n fault types; determine a fault response group to which the determined fault type belongs from among m fault response groups; encode the determined fault response group; and transmit the encoded fault response group via a communication interface; and a phase controller configured to: receive the encoded fault response group from the point-of-use controller via the communication interface; determine the fault response group; decode the determined fault response group; and output the decoded fault response group.

In some aspects, the techniques described herein relate to a system, wherein m<n, each of the m fault response groups is unique, and a number of the m fault response groups is exactly equal to a number of unique fault responses.

In some aspects, the techniques described herein relate to a system, wherein the communication interface is a single channel bi-directional interface.

In some aspects, the techniques described herein relate to a system, wherein the point-of-use controller is a remote mounted gate driver integrated circuit in a high voltage area of the inverter separated from a low voltage area of the inverter by a galvanic isolator, and the phase controller is a control integrated circuit in the high voltage area of the inverter.

In some aspects, the techniques described herein relate to a system, wherein the point-of-use controller is further configured to store the fault type, the phase controller is further configured to transmit, to the point-of-use controller, a request for the stored fault type, and the point-of-use controller is further configured to receive the request from the phase controller for the stored fault type, and transmit the stored fault type to the phase controller based on the request.

In some aspects, the techniques described herein relate to a system, wherein the point-of-use controller is further configured to store first mapping information that maps each of the n fault types to a respective fault response group from among the m fault response groups; and wherein the phase controller is further configured to store second mapping information that maps each of the m fault response groups to the decoded fault response group.

In some aspects, the techniques described herein relate to a system, further including: the battery configured to supply the DC power to the inverter; and the motor configured to receive the AC power from the inverter to drive the motor.

In some aspects, the techniques described herein relate to a method including: detecting, by a point-of-use controller for an inverter for an electric vehicle, a fault; determining, by the point-of-use controller, a fault type of the detected fault from among n fault types; determining, by the point-of-use controller, a fault response group to which the determined fault type belongs from among m fault response groups; encoding, by the point-of-use controller, the determined fault response group; and transmitting, by the point-of-use controller, the encoded fault response group via a communication interface to a phase controller for the inverter for the electric vehicle.

In some aspects, the techniques described herein relate to a method, wherein m<n.

In some aspects, the techniques described herein relate to a method, wherein the communication interface is a single channel bi-directional interface.

In some aspects, the techniques described herein relate to a method, wherein the point-of-use controller is a remote mounted gate driver integrated circuit, and the phase controller is a control integrated circuit.

In some aspects, the techniques described herein relate to a method, further including: storing, by the point-of-use controller, the fault type.

In some aspects, the techniques described herein relate to a method, further including: receiving, by the point-of-use controller, a request from the phase controller for the stored fault type; and transmitting, by the point-of-use controller, the stored fault type to the phase controller based on the request.

In some aspects, the techniques described herein relate to a method, further including: storing, by the point-of-use controller, mapping information that maps each of the n fault types to a respective fault response group from among the m fault response groups, wherein the determining, by the point-of-use controller, the fault response group includes determining the fault response group based on the stored mapping information.

In some aspects, the techniques described herein relate to a method for communication between a point-of-use controller for an inverter for an electric vehicle and a phase controller for the inverter for the electric vehicle, the method including: receiving, by the phase controller, an encoded fault response group from the point-of-use controller via a communication interface; determining, by the phase controller, the fault response group from among m fault response groups; decoding, by the phase controller, the determined fault response group; and outputting, by the phase controller, the decoded fault response group.

In some aspects, the techniques described herein relate to a method, further including: transmitting, by the phase controller, a request for a stored fault type, from among n fault types, to the point-of-use controller; and receiving, by the phase controller, the stored fault type from the point-of-use controller.

In some aspects, the techniques described herein relate to a method, wherein m<n.

In some aspects, the techniques described herein relate to a method, further including: storing, by the phase controller, mapping information that maps each of the m fault response groups to the decoded fault response group; wherein the decoding, by the phase controller, the determined fault response group includes determining the fault response group based on the stored mapping information.

In some aspects, the techniques described herein relate to a method, wherein the decoded fault response group corresponds to states for fault pins of a multi-wire communication bus.

In some aspects, the techniques described herein relate to a method, further including: receiving, by the phase controller, a fault response, based on the outputting the decoded fault response group; and sending, by the phase controller, the fault response to the point-of-use controller.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
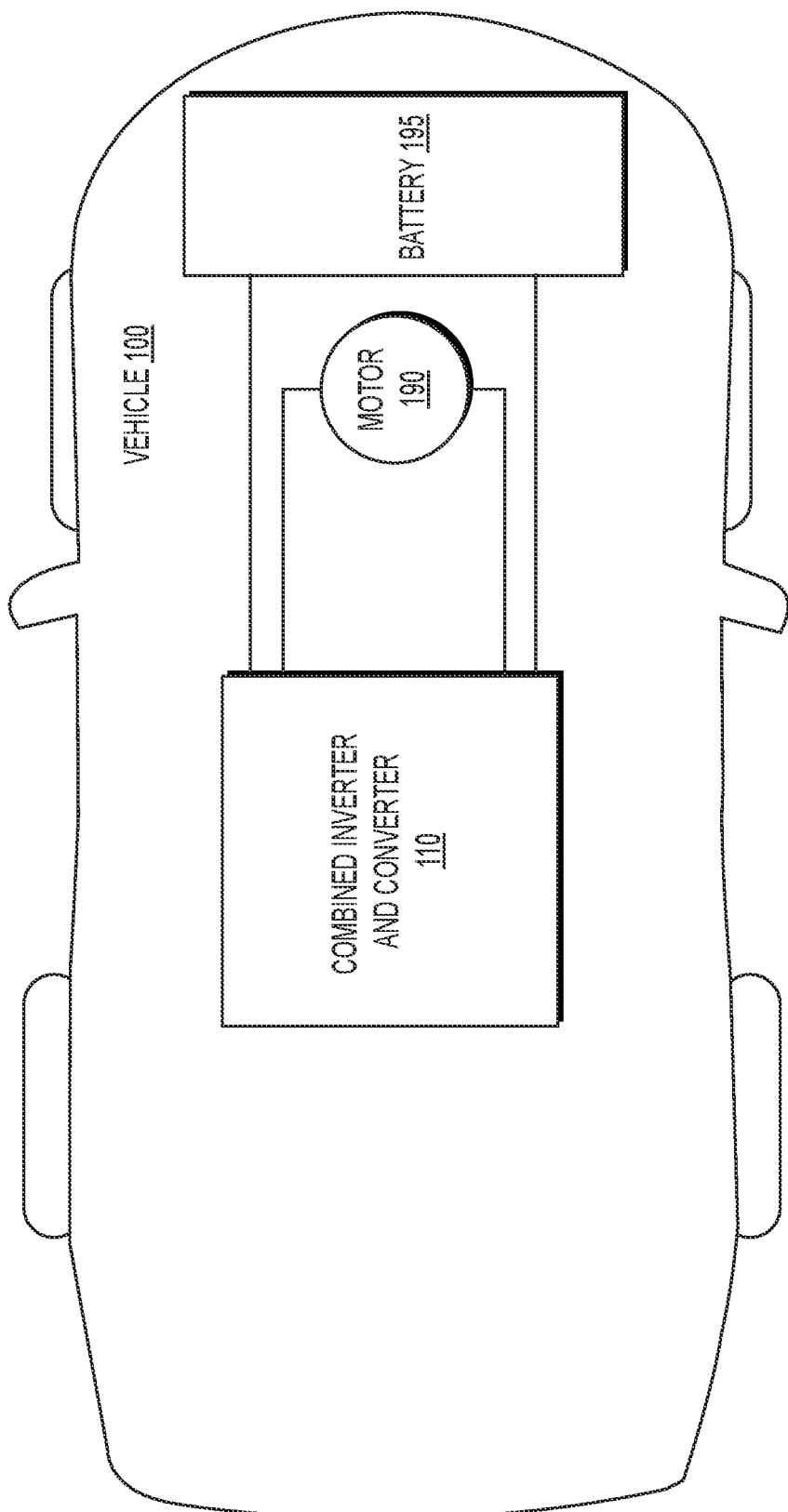
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for fault encoding and compression using a single channel, and, more particularly, to techniques for encoding a fault using a fault response group to which a fault type of the fault belongs.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

In an electric vehicle, a point-of-use controller (e.g., a remote mounted driver integrated circuit) may detect faults, and report the faults to a phase controller (e.g., a control integrated circuit) using a single channel (e.g., a communication interface). The point-of-use controller should report the fault quickly in order to limit a delay between detecting the fault and receiving a command for a desired reaction. To minimize delay, the amount of data that can be transmitted via the single channel for fault messaging might be severely limited. Further, the transmission of fault messaging should not consume substantial bandwidth of the single channel in order to reduce an impact on other messaging communicated via the single channel. The single channel may be a single wire having only one channel. The single channel may be a single wire having exactly one channel. The single channel may be a single wire having no more than one channel.

As addressed above, the transmission of fault messaging via the single channel between the point-of-use controller and the phase controller might be limited. The point-of-use controller might be configured to detect several unique fault types of faults. The time and bandwidth consumption required for reporting the large number of unique fault types of faults might be unacceptable. However, numerous unique types of faults detectable by the point-of-use controller might require a common fault response.

In light of the foregoing, one or more embodiments herein may provide techniques to encode a fault using a fault response group to which a fault type of the fault belongs. For example, a fault may include an over-current, supply under-voltage, FET gate stuck fully on, FET gate stuck on in a saturated state, FET gate stuck in a low state, FET gate connection open, FET source sense connection open, over-temperature, over-current retry counter expired, invalid message received, or reset has occurred and the point-of-use IC needs to be configured. Each of the fault types belonging to a particular fault group require the same fault response. For example, fault types may include (1) FET was commanded off automatically and a persistent fault prevents the FET from being turned on until the fault is resolved, (2) FET was commanded off automatically and cycling the command state is required to retry turning the FET back on, and (3) FET is in a stuck on in a saturated state, and turning on the opposing FET could result in uncontrollable overheating and destruction of the FET. Fault responses may include (1) turn all three upper phase FETs on and all three lower phase FETs off, (2) turn all three lower phase FETs on and all three upper phase FETs off, and (3) turn all six FETs off. Accordingly, by reporting the encoded fault response group instead of an encoded fault type, the point-of-use controller may substantially reduce an amount of data to be transmitted via the single channel. The encoding reduces delay compared to sending limited information to the inverter controller 300, which requires the inverter controller 300 to read a Serial Peripheral Interface (SPI) of the phase controller to differentiate detailed fault information in order to provide a correct response. As fault encoding is done in parallel, with all fault pins going to a final state, encoding may be faster than serial data communication. In this way, some embodiments herein may improve fault messaging between integrated circuits of electric vehicles, reduce delay associated with fault messaging via a single channel, and conserve bandwidth of the single channel. For example, faults may be reported in 20 μs, which is much faster than serial data communication. The point-of-use controller may maintain a history of an exact fault type and the fault that caused the encoded fault response group to be sent. The phase controller may request the stored exact fault type from the point-of-use controller after the phase controller has sent an appropriate fault response to the point-of-use controller. Once the point-of-use controller has received the appropriate fault response to initiate a response, the phase controller may request the stored exact fault type without an impact to a fast response by the point-of-use controller. In the context of the electric vehicle, this fast reaction time may help the electric vehicle to be placed in a safe state in a relatively short time.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
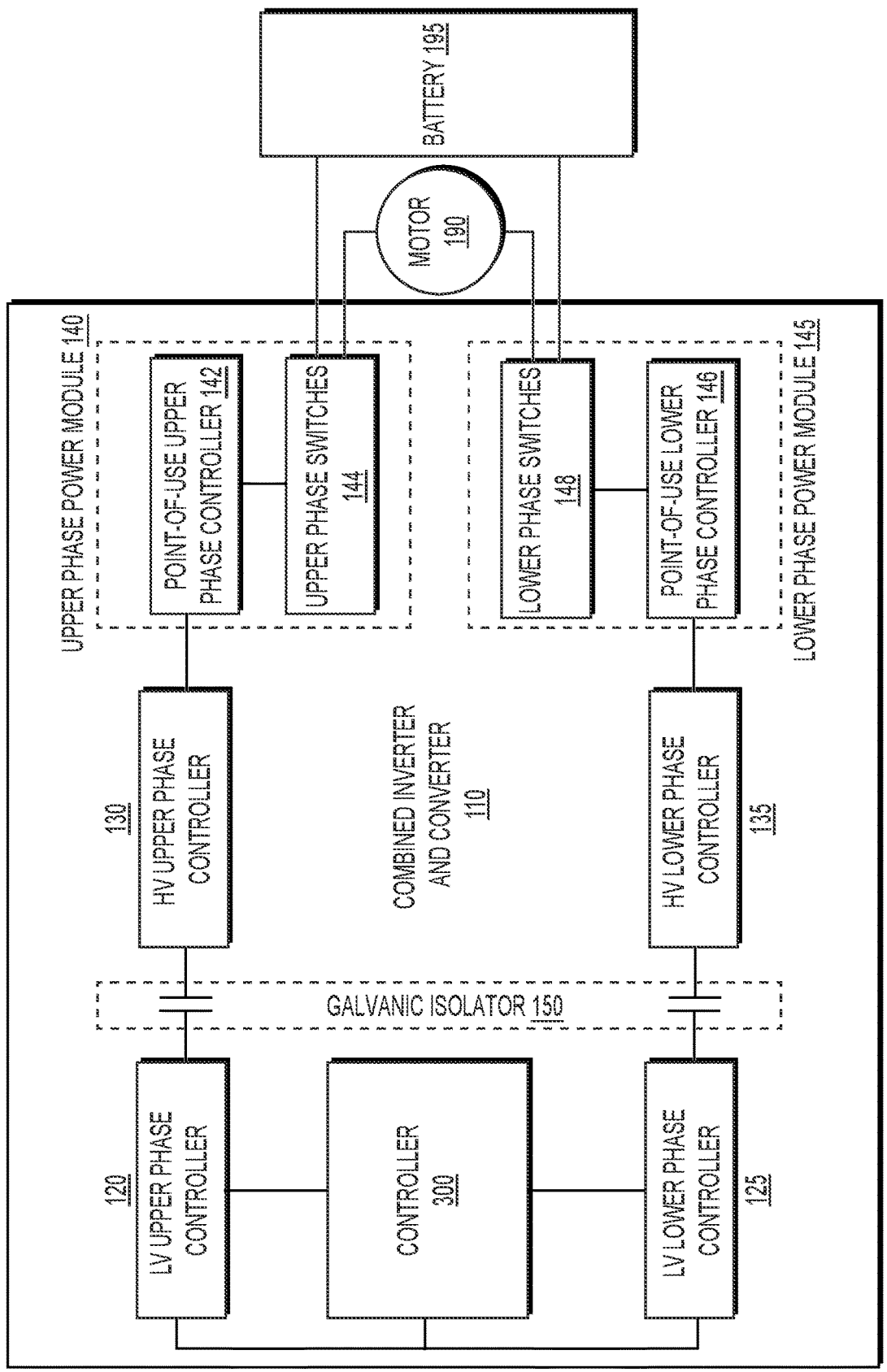
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
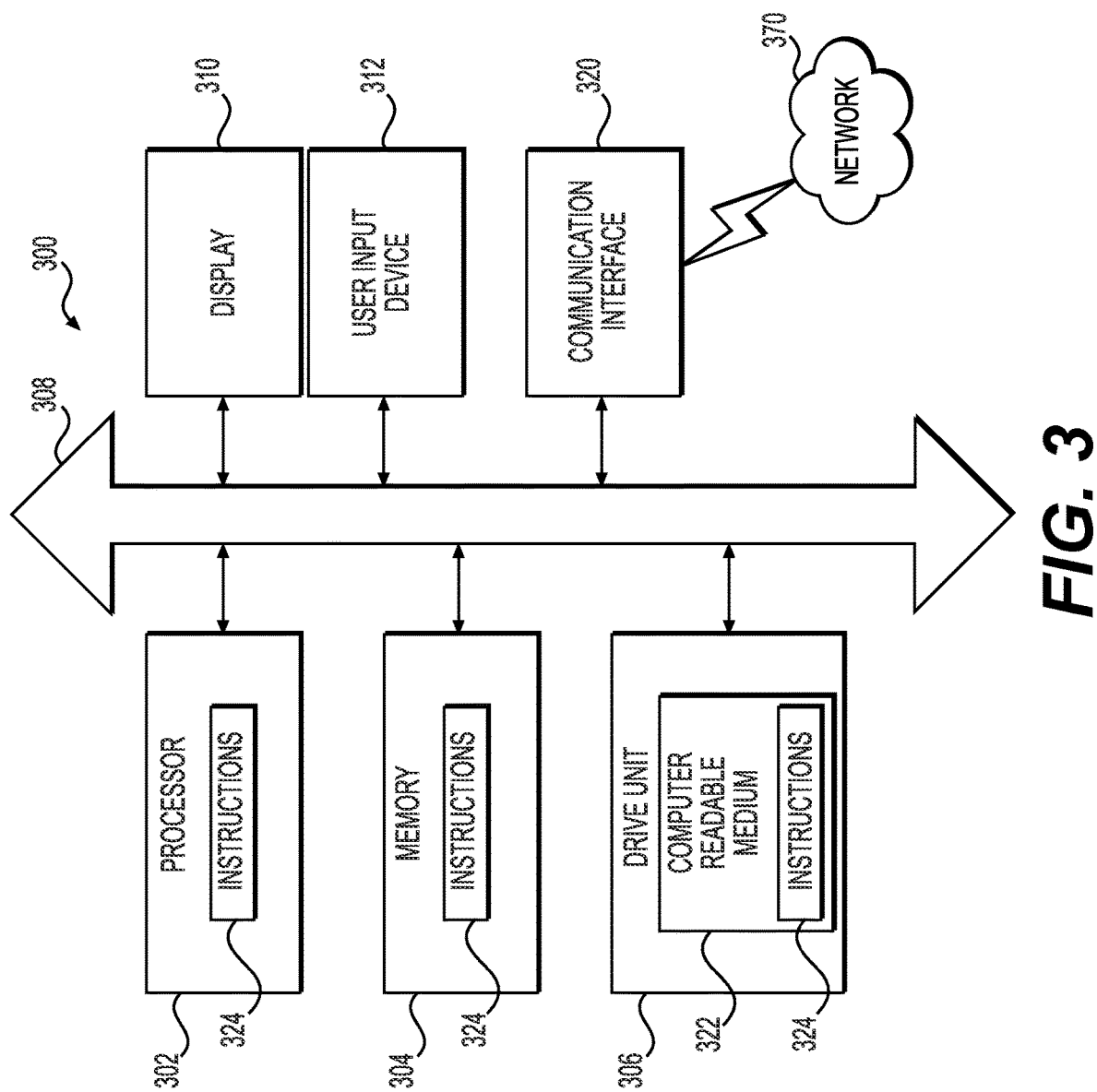
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
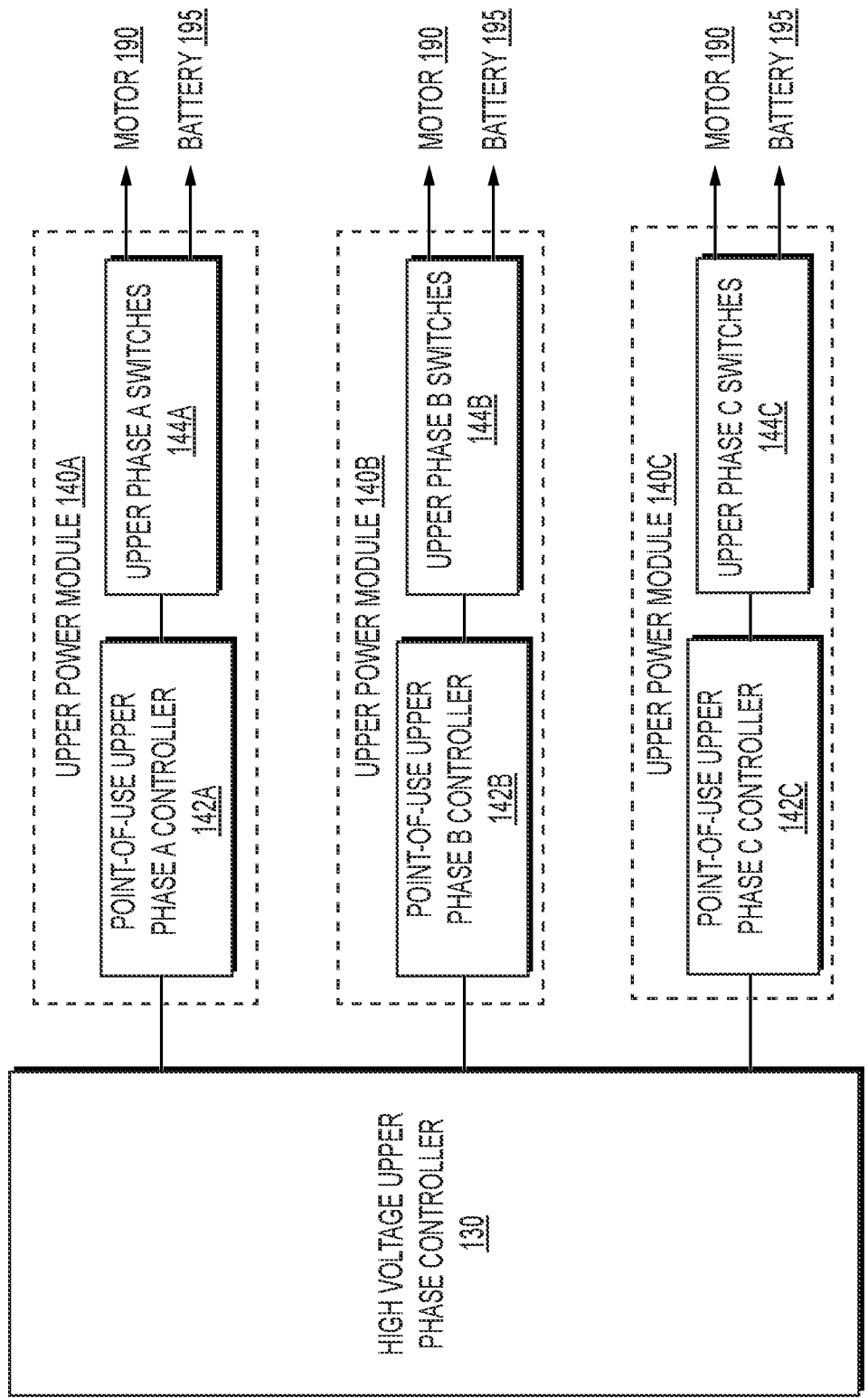
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
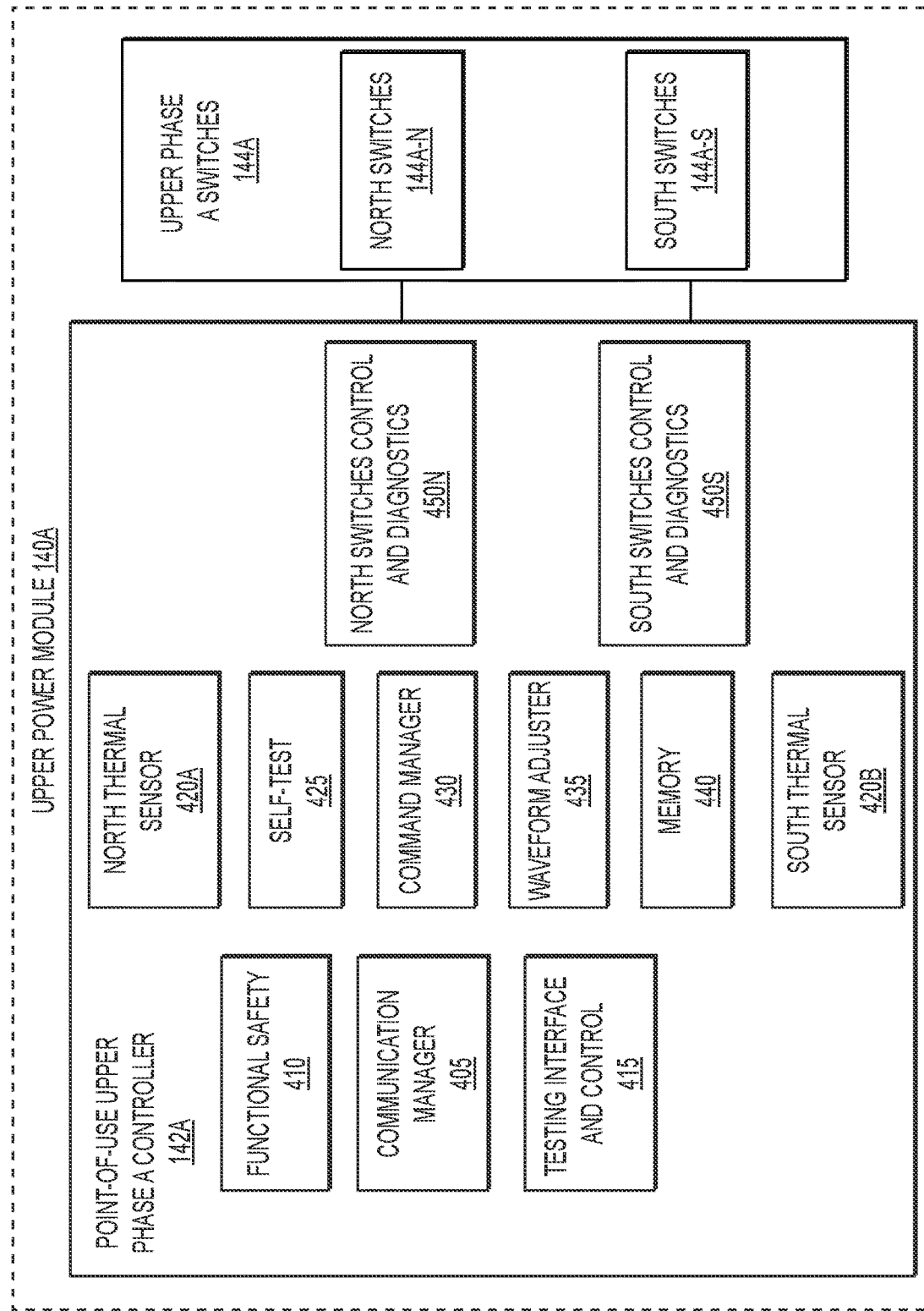
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
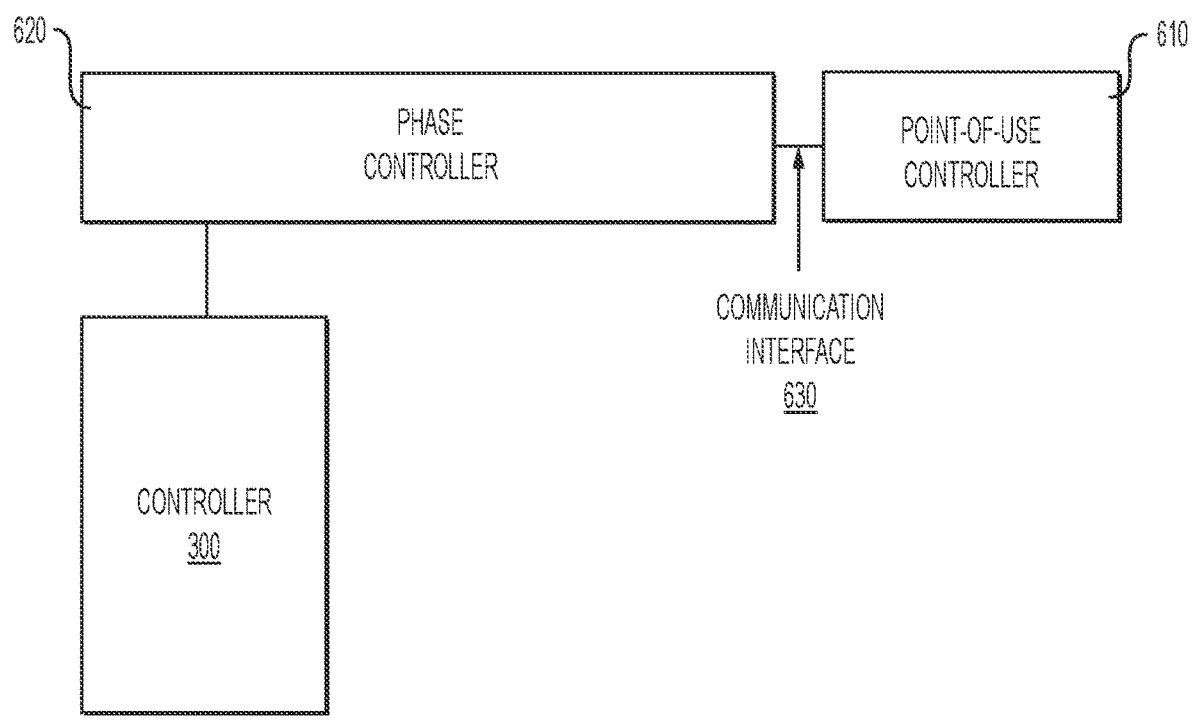
FIG. 6 depicts an exemplary system infrastructure for fault encoding and compression using a single channel, according to one or more embodiments.

FIG. 6 depicts an exemplary system infrastructure for fault encoding and compression using a single channel, according to one or more embodiments. As shown in FIGS. 1 and 2, vehicle 100 may include inverter 110. Inverter 110 may include, as shown in FIG. 6, inverter controller 300, a point-of-use controller 610, a phase controller 620, and a communication interface 630. In some implementations, the point-of-use controller 610 may be a remote mounted gate driver integrated circuit, and the phase controller 620 may be a control integrated circuit. In some implementations, the communication interface 630 may be a single channel, or single wire, interface. The single channel may be a single wire having only one channel. The single channel may be a single wire having exactly one channel. The single channel may be a single wire having no more than one channel. In some implementations, the communication interface 630 may be bi-directional. For example, point-of-use controller 610 may be an implementation of point-of-use upper phase A controller 142A of inverter 110. For example, phase controller 620 may be an implementation of high voltage upper phase controller 130 and low voltage upper phase controller 120 of inverter 110. For example, communication interface 630 may be an implementation of a communication interface between point-of-use upper phase A controller 142A and high voltage upper phase controller 130.

Figure 7:
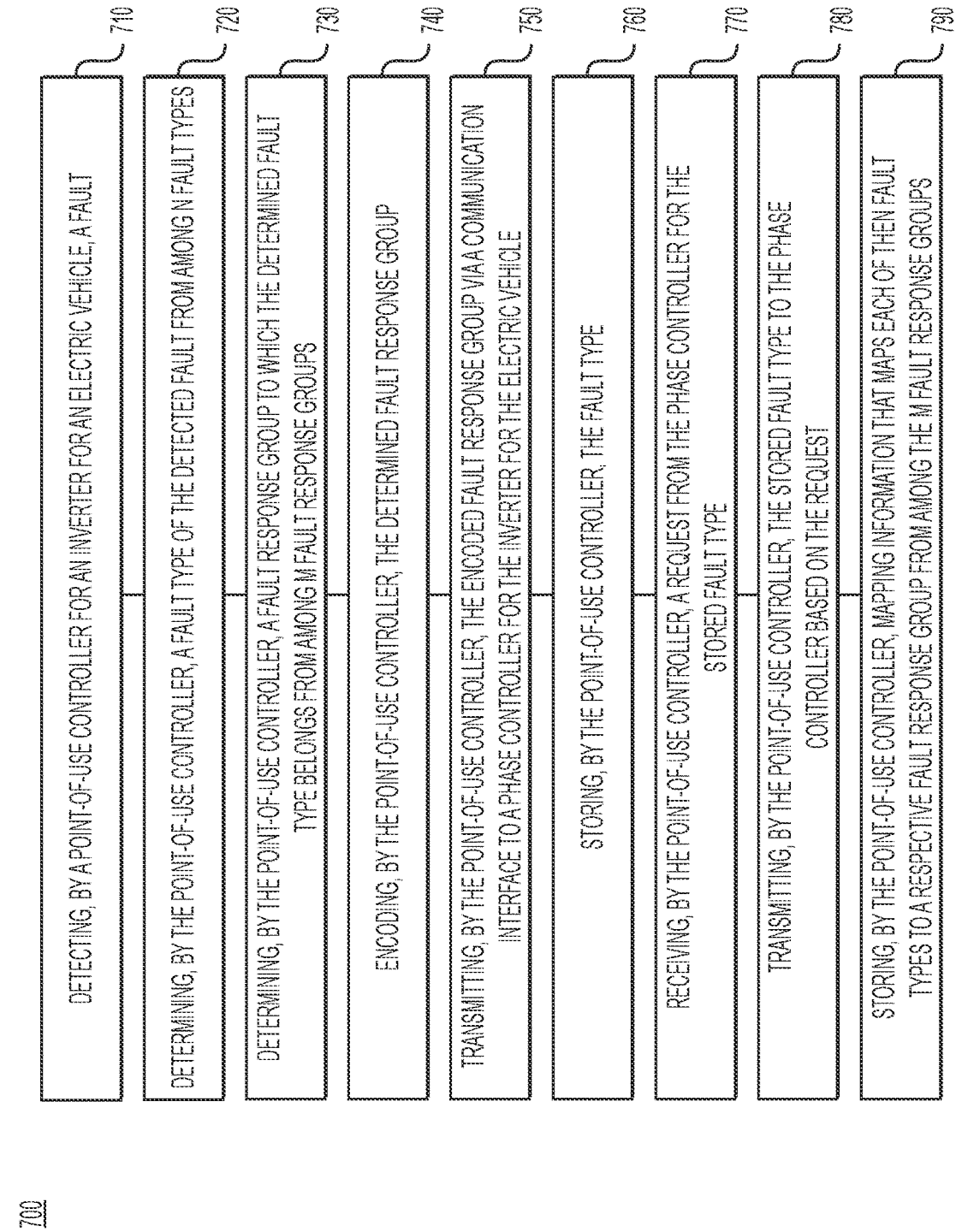
FIG. 7 depicts an exemplary method for encoding a fault response group, according to one or more embodiments.

FIG. 7 depicts a method 700 for encoding a fault response group, according to one or more embodiments. As shown in FIG. 7, a method 700 may include detecting, by a point-of-use controller 610 for inverter 110 of electric vehicle 100, a fault (operation 710). For example, the point-of-use controller 610 may detect a fault using any suitable fault detection technique. Method 700 may include determining, by the point-of-use controller 610, a fault type of the detected fault from among n unique fault types (operation 720). A fault type may identify a particular type of fault. The point-of-use controller 610 may store fault type information that identifies n unique fault types that are detectable by the point-of-use controller 610, and determine the fault type based on the fault type information. As an example, and referring to faults 910 of FIG. 9, the point-of-use controller 610 may be configured to detect n unique fault types (e.g., Fault X, Fault X+1, . . . , Fault X+14). Although fifteen fault types are shown in FIG. 9, it should be understood that other implementations may include any number of unique fault types.

As shown in FIG. 7, method 700 may include determining, by the point-of-use controller 610, a fault response group to which the fault type belongs from among m unique fault response groups (operation 730). A fault response group may identify a particular group of fault types that share some commonality. For example, each fault type within a particular fault response group may elicit a common fault response from the phase controller 620. Accordingly, the number of m unique fault response groups may be exactly equal to the number of m unique fault responses. The m unique fault response groups may be less than the n unique fault types. The point-of-use controller 610 may store fault response group information that identifies the m unique fault response groups, and determine the fault response group to which the fault type belongs based on the fault response group information and mapping information that maps each of the n unique fault types to a respective fault response group from among the m unique fault response groups.

Figure 9:
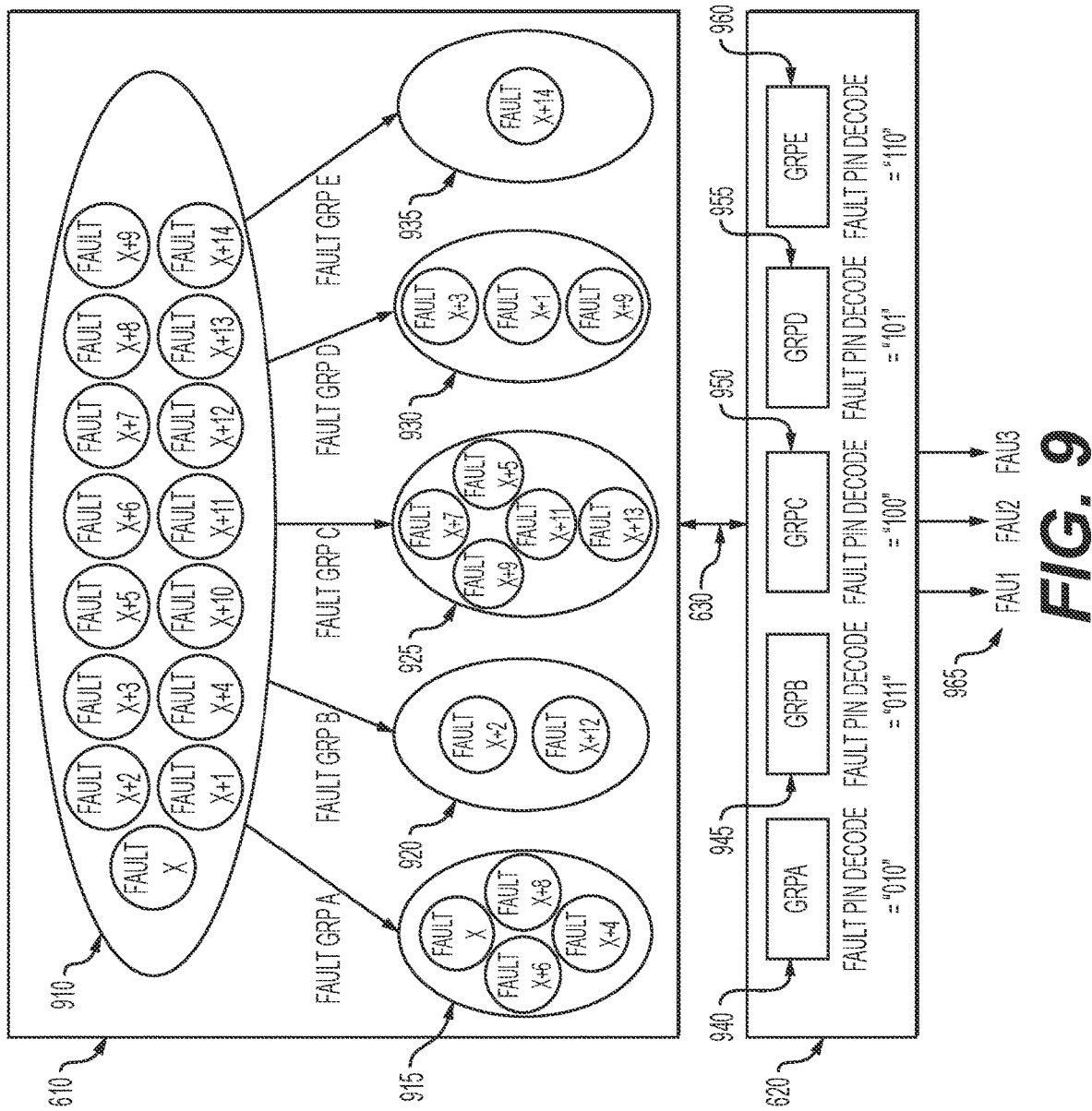
FIG. 9 depicts an exemplary system infrastructure for fault encoding and compression using a single channel, according to one or more embodiments.

As an example, and referring to FIG. 9, the point-of-use controller 610 may store fault response group information that a first set of fault types (Fault X, Fault X+4, Fault X+6, and Fault X+8) belongs to a first fault response group ("Fault Group A") 915, a second set of fault types (Fault X+2 and Fault X+12) belongs to a second fault response group ("Fault Group B") 920, a third set of fault types (Fault X+5, Fault X+7, Fault X+9, Fault X+11, and Fault X+13) belongs to a third fault response group ("Fault Group C") 925, a fourth set of fault types (X+1, X+3, and X+9) belongs to a fourth fault response group ("Fault Group D") 930, and a fifth set of fault types (X+14) belongs to a fifth fault response group ("Fault Group E") 935. Again, it should be understood that implementations may include any number of fault response groups, with each group including any number of fault types. As an example of determining the fault response group to which the fault type belongs, when the point-of-use controller 610 determines a fault type of "Fault X," the point-of-use controller 610 determines the fault belongs to first fault response group ("Fault Group A") 915.

As shown in FIG. 7, method 700 may include encoding, by the point-of-use controller 610, the determined fault response group (operation 740). For example, the point-of-use controller 610 may encode the fault response group using encoding information that maps a fault response group to a code. Method 700 may include transmitting, by the point-of-use controller 610, the encoded fault response group via communication interface 630 to the phase controller 620 (operation 750). In this way, the point-of-use controller 610 may transmit an encoded fault response group instead of an encoded fault, which may permit the point-of-use controller 610 to reduce an amount of data that is communicated via the communication interface 630. At this stage, the phase controller 620 has received only the encoded fault response group among the m unique fault response groups, and has not received a fault type among the n unique fault types. Method 700 may include storing, by the point-of-use controller 610, the fault type (operation 760).

Method 700 may include receiving, by the point-of-use controller 610, a request from the phase controller 620 for the stored fault type (operation 770), and transmitting, by the point-of-use controller 610, the stored fault type to the phase controller 620 based on the request (operation 780). Method 700 may include storing, by the point-of-use controller 610, mapping information that maps each of the n fault types to a respective fault response group from among the m fault response groups (operation 790). Here, operation 730 may further include determining the fault response group based on the stored mapping information.

Figure 8:
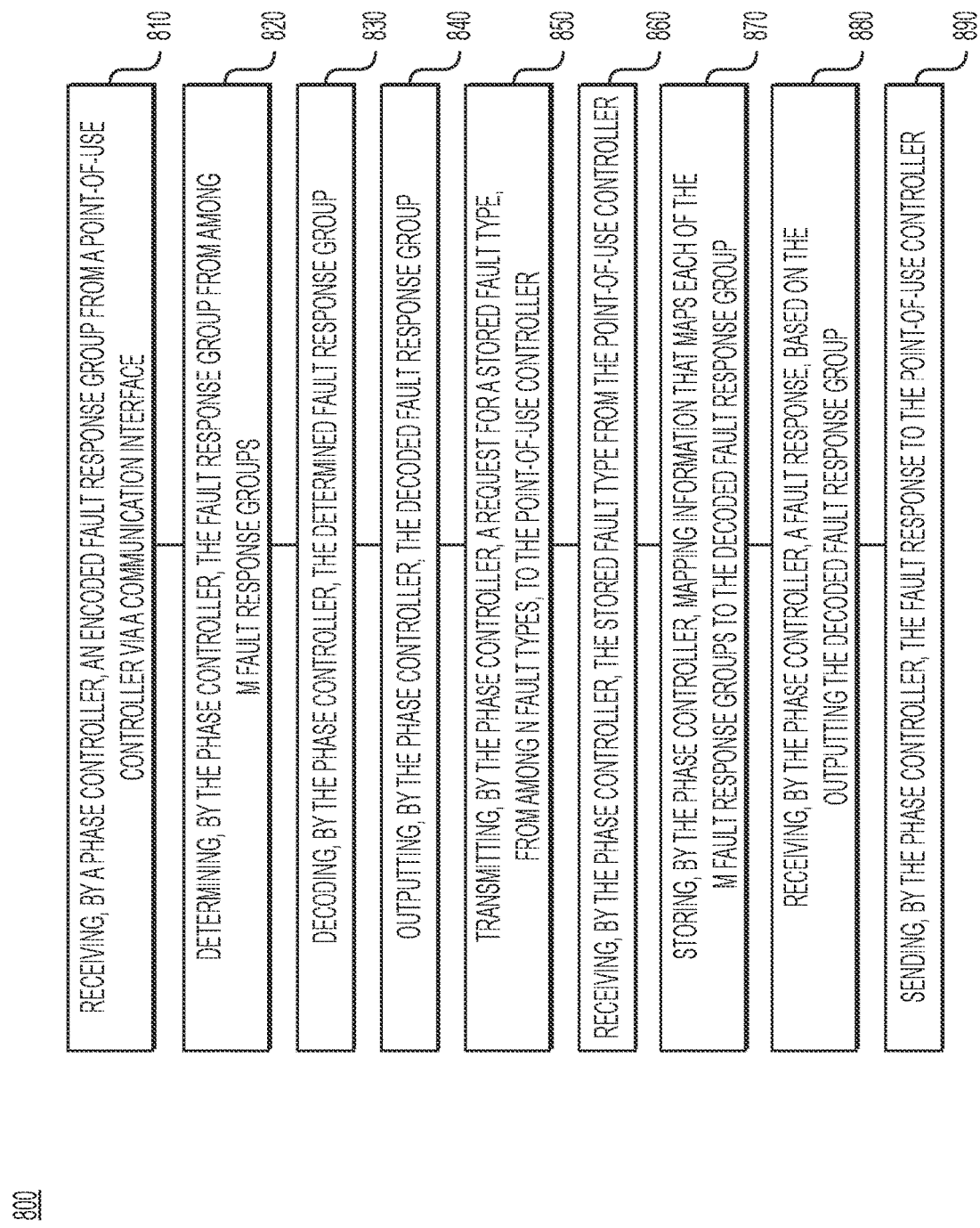
FIG. 8 depicts an exemplary method for decoding a fault response group, according to one or more embodiments.

FIG. 8 depicts a method 800 for decoding a fault response group, according to one or more embodiments. As shown in FIG. 8, method 800 may include receiving, by the phase controller 620 of the electric vehicle 100, the encoded fault response group from the point-of-use controller 610 via the communication interface 630 (operation 810). At this stage, the phase controller 620 has received only the encoded fault response group among the m unique fault response groups, and has not received a fault type among the n unique fault types. Method 800 may include determining, by the phase controller 620, the fault response group from among m fault response groups (operation 820), decoding, by the phase controller 620, the determined fault response group (operation 830), and outputting, by the phase controller 620, the decoded fault response group (operation 840). As an example, and referring to FIG. 9, the phase controller 620 may decode the first fault response group ("Group A") 940 as a first code ("010"), decode the second fault response group ("Group B") 945 as a second code ("011"), decode the third fault response group ("Group C") 950 as a third code ("100"), decode the fourth fault response group ("Group D") 955 as a fourth code ("101"), and decode the fifth fault response group ("Group E") 960 as a fifth code ("110").

As shown in FIG. 8, method 800 may include transmitting, by the phase controller 620, a request for a stored fault type, from among n fault types, to the point-of-use controller 610 (operation 850), and receiving, by the phase controller 620, the stored fault type from the point-of-use controller 610 (operation 860). Method 800 may include storing, by the phase controller 620, mapping information that maps each of the m fault response groups to the decoded fault response group (operation 870). Operation 830 may further include determining the fault response group based on the stored mapping information. Method 800 may include receiving, by the phase controller 620, a fault response, based on the outputting the decoded fault response group (operation 880), and sending, by the phase controller 620, the fault response to the point-of-use controller 610 (operation 890). For example, phase controller 620 may output the decoded fault response group to inverter controller 300, receive a fault response from inverter controller 300, and send the fault response to point-of-use controller 610. Alternatively or additionally, phase controller 620 may determine a fault response based on the decoded fault response group, and send the fault response to point-of-use controller 610. Because the number of m unique fault response groups is exactly equal to the number of m unique fault responses, each unique decoded fault response group correlates with a unique fault response.

FIG. 9 depicts an exemplary system infrastructure for fault encoding and compression using a single channel, according to one or more embodiments. Referring to FIG. 9, the phase controller 620 may output the fault response group on a multi-wire communication bus 965 including three fault pins ("Fault 1," "Fault 2," and "Fault 3") based on the particular fault response group as decoded by the phase controller 620. For example, the phase controller 620 may output, to inverter controller 300 of the electric vehicle 100, the decoded ("Group A") 940 corresponding to the first code ("010") by setting fault pin FAU1 of multi-wire communication bus 965 to a low state ("0"), setting fault pin FAU2 of multi-wire communication bus 965 to a high state ("1"), and setting fault pin FAU3 of multi-wire communication bus 965 to a low state ("0"). One or more embodiments may include receiving a fault response, based on the fault response group as output by the phase controller 620 on multi-wire communication bus 965, from inverter controller 300 of the electric vehicle 100, and sending the fault response from inverter controller 300 to the point-of-use controller 610.

The point-of-use controller 610 may be capable of sending messages having various length and complexity. The point-of-use controller 610 may send very long and detailed fault messages, or very fast and simple fault messages, depending upon the urgency. Urgent faults may be sent in a fast format, such as a format taking less than approximately 20 μS to complete, and may be grouped into responses that are communicated to the inverter controller 300 via fault pins, such as fault pins "Fault 1," "Fault 2," and "Fault 3", for example. The fault pins may be programmed to represent the fault information in different ways. Each fault pin may represent a fault on a particular phase. The fault pins, as a group, may represent an encoded data word, such as from 001 to 111, when three fault pins are use. The number of fault pins may be less than three or more than three. The fault pins may be encoded to communicate the highest priority fault or the latest fault, regardless of relative priority. For example, encoding groups may be "001"=all FETs are off due to a global fault, "010"=one or more FETs are off due to over-current, "011"=one or more FETs off due to fault at point-of-use controller 610, and "100"=one or more FETs stuck in an on-state. The system response to each encoded group condition may be different.

In some implementations, the point-of-use controller 610 may store the fault type of the fault. In this case, the phase controller 620 may provide, to the point-of-use controller 610, a request for the stored fault type of the fault. The point-of-use controller 610 may receive the request for the stored fault type of the fault from the phase controller 620, and transmit the stored fault type of the fault to the phase controller 620 based on the request. For example, inverter controller 300 may use a Serial Peripheral Interface (SPI) to read detailed fault information from the phase controller 620.

One or more embodiments herein may provide techniques to encode a fault using a fault response group to which a fault type of the fault belongs. Each of the fault types belonging to a particular fault group require the same fault response. Accordingly, by reporting the encoded fault response group instead of an encoded fault type, the point-of-use controller may substantially reduce an amount of data to be transmitted via the single channel. In this way, some embodiments herein may improve fault messaging between integrated circuits of electric vehicles, reduce delay associated with fault messaging via a single channel, and conserve bandwidth of the single channel. The point-of-use controller may maintain a history of an exact fault type that caused the encoded fault response group to be sent. The phase controller may request the stored exact fault type from the point-of-use controller after the phase controller has sent an appropriate fault response to the point-of-use controller. Once the point-of-use controller has received the appropriate fault response to initiate a response, the phase controller may request the stored exact fault type without an impact to a fast response by the point-of-use controller. In the context of the electric vehicle, this fast reaction time may help the electric vehicle to be placed in a safe state in a relatively short time.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
a point-of-use controller configured to:
detect a fault;
determine a fault type of the detected fault from among n fault types;
determine a fault response group to which the determined fault type belongs from among m fault response groups;
encode the determined fault response group; and
transmit the encoded fault response group via a communication interface; and
a phase controller configured to:
receive the encoded fault response group from the point-of-use controller via the communication interface;
determine the fault response group;
decode the determined fault response group; and
output the decoded fault response group.

2. The system of claim 1, wherein
m<n
each of the m fault response groups is unique, and
a number of the m fault response groups is exactly equal to a number of unique fault responses.

3. The system of claim 1, wherein the communication interface is a single channel bi-directional interface.

4. The system of claim 1, wherein the point-of-use controller is a remote mounted gate driver integrated circuit in a high voltage area of the inverter separated from a low voltage area of the inverter by a galvanic isolator, and the phase controller is a control integrated circuit in the high voltage area of the inverter.

5. The system of claim 1, wherein
the point-of-use controller is further configured to store the fault type,
the phase controller is further configured to transmit, to the point-of-use controller, a request for the stored fault type, and
the point-of-use controller is further configured to receive the request from the phase controller for the stored fault type, and transmit the stored fault type to the phase controller based on the request.

6. The system of claim 1,
wherein the point-of-use controller is further configured to store first mapping information that maps each of the n fault types to a respective fault response group from among the m fault response groups; and
wherein the phase controller is further configured to store second mapping information that maps each of the m fault response groups to the decoded fault response group.

7. The system of claim 1, further comprising:
the battery configured to supply the DC power to the inverter; and
the motor configured to receive the AC power from the inverter to drive the motor.

8. A method comprising:
detecting, by a point-of-use controller for an inverter for an electric vehicle, a fault;
determining, by the point-of-use controller, a fault type of the detected fault from among n fault types;
determining, by the point-of-use controller, a fault response group to which the determined fault type belongs from among m fault response groups;
encoding, by the point-of-use controller, the determined fault response group; and
transmitting, by the point-of-use controller, the encoded fault response group via a communication interface to a phase controller for the inverter for the electric vehicle.

9. The method of claim 8, wherein m<n.

10. The method of claim 8, wherein the communication interface is a single channel bi-directional interface.

11. The method of claim 8, wherein the point-of-use controller is a remote mounted gate driver integrated circuit, and the phase controller is a control integrated circuit.

12. The method of claim 8, further comprising:
storing, by the point-of-use controller, the fault type.

13. The method of claim 12, further comprising:
receiving, by the point-of-use controller, a request from the phase controller for the stored fault type; and
transmitting, by the point-of-use controller, the stored fault type to the phase controller based on the request.

14. The method of claim 8, further comprising:
storing, by the point-of-use controller, mapping information that maps each of the n fault types to a respective fault response group from among the m fault response groups,
wherein the determining, by the point-of-use controller, the fault response group comprises determining the fault response group based on the stored mapping information.

15. A method for communication between a point-of-use controller for an inverter for an electric vehicle and a phase controller for the inverter for the electric vehicle, the method comprising:
receiving, by the phase controller, an encoded fault response group from the point-of-use controller via a communication interface;
determining, by the phase controller, the fault response group from among m fault response groups;
decoding, by the phase controller, the determined fault response group; and
outputting, by the phase controller, the decoded fault response group.

16. The method of claim 15, further comprising:
transmitting, by the phase controller, a request for a stored fault type, from among n fault types, to the point-of-use controller; and receiving, by the phase controller, the stored fault type from the point-of-use controller.

17. The method of claim 16, wherein m<n.

18. The method of claim 15, further comprising:
storing, by the phase controller, mapping information that maps each of the m fault response groups to the decoded fault response group;
wherein the decoding, by the phase controller, the determined fault response group comprises determining the fault response group based on the stored mapping information.

19. The method of claim 18, wherein the decoded fault response group corresponds to states for fault pins of a multi-wire communication bus.

20. The method of claim 15, further comprising:
receiving, by the phase controller, a fault response, based on the outputting the decoded fault response group; and
sending, by the phase controller, the fault response to the point-of-use controller.

* * * * *

UNITED STATES PATENT AND TRADEMARK OFFICE
CERTIFICATE OF CORRECTION

| | | |
|---|---|---|
| PATENT NO. | : 12,179,610 B2 | Page 1 of 1 |
| APPLICATION NO. | : 18/063381 | |
| DATED | : December 31, 2024 | |
| INVENTOR(S) | : Marc R. Engelhardt et al. | |

It is certified that error appears in the above-identified patent and that said Letters Patent is hereby corrected as shown below:

In the Claims
Column 17, Line 46, in Claim 2, delete "m<n" and insert --m<n,--.

Signed and Sealed this
Twenty-fifth Day of February, 2025

Coke Morgan Stewart
*Acting Director of the United States Patent and Trademark Office*